United States Patent
Benea-Chelmus et al.

(10) Patent No.: US 12,431,637 B2
(45) Date of Patent: Sep. 30, 2025

(54) ON-CHIP TERAHERTZ THIN-FILM DEVICES

(71) Applicants: ECOLE POLYTECHNIQUE FEDERALE DE LAUSANNE (EPFL), Lausanne (CH); ETH ZURICH, Zurich (CH); PRESIDENT AND FELLOWS OF HARVARD COLLEGE, Cambridge, MA (US)

(72) Inventors: Ileana-Cristina Benea-Chelmus, Echichens (CH); Marko Loncar, Belmont, MA (US); Jerome Faist, Zurich (CH); Alessandro Tomasino, Renens (CH); Amirhassan Shams-Ansari, Arlington, MA (US); Alexa Herter, Zurich (CH); Yazan Lampert Almahmoud, Chavannes-près-Renens (CH)

(73) Assignees: ECOLE POLYTECHNIQUE FEDERALE DE LAUSANNE (EPFL), Lausanne (CH); ETH ZURICH, Zurich (CH); PRESIDENT AND FELLOWS OF HARVARD COLLEGE, Cambridge, MA (US)

( * ) Notice: Subject to any disclaimer, the term of this patent is extended or adjusted under 35 U.S.C. 154(b) by 185 days.

(21) Appl. No.: 18/213,691

(22) Filed: Jun. 23, 2023

(65) Prior Publication Data
US 2024/0429627 A1 Dec. 26, 2024

(51) Int. Cl.
*H01Q 21/28* (2006.01)
*H01L 23/66* (2006.01)
*H01Q 1/22* (2006.01)

(52) U.S. Cl.
CPC ............ *H01Q 21/28* (2013.01); *H01L 23/66* (2013.01); *H01Q 1/2283* (2013.01); *H01L 2223/6677* (2013.01)

(58) Field of Classification Search
CPC ...... H01Q 21/28; H01Q 1/2283; H01L 23/66; H01L 2223/6677; H01L 2223/6627
See application file for complete search history.

(56) References Cited

U.S. PATENT DOCUMENTS 6,967,347 B2 * 11/2005 Estes .................... G02B 6/4201
257/30
8,340,145 B2 * 12/2012 Walther .................. H10F 77/14
257/14

(Continued)

OTHER PUBLICATIONS

Yannick Salamin, et al., "Compact and ultra-efficient broadband plasmonic terahertz field detector," Nature Communications, vol. 10, pp. 1-8 (Dec. 5, 2019).

(Continued)

*Primary Examiner* — Seung H Lee
(74) *Attorney, Agent, or Firm* — Maschoff Brennan

(57) ABSTRACT

A terahertz device for detecting or emitting or for both detecting and emitting electromagnetic waves in the terahertz frequency range. The terahertz device comprises: a first waveguide branch and a second waveguide branch, the first and second waveguide branches being configured to allow optical signals to propagate through them, the first and second waveguide branches being nonlinear dielectric elements with a thickness of at most 500 micrometres; and an antenna arrangement comprising a set of antennas for capturing and/or emitting electromagnetic waves in the terahertz frequency range, the antennas being placed along at least one of the waveguide branches in an immediate vicinity of the respective waveguide branch and/or around the respective waveguide branch to at least partially enclose the (Continued)

respective waveguide branch in a respective antenna gap of the respective antenna.

20 Claims, 8 Drawing Sheets

(56) References Cited

U.S. PATENT DOCUMENTS

| | | | |
|---|---|---|---|
| 10,341,021 B2* | 7/2019 | Pinguet | G02B 6/124 |
| 11,499,915 B2 | 11/2022 | Salamin et al. | |
| 2005/0242287 A1* | 11/2005 | Hakimi | G02F 1/353 |
| | | | 250/363.09 |
| 2007/0237444 A1* | 10/2007 | Keil | B82Y 20/00 |
| | | | 385/40 |
| 2010/0084570 A1* | 4/2010 | Katagiri | H01Q 13/085 |
| | | | 250/458.1 |

OTHER PUBLICATIONS

Ileana-Cristina Benea-Chelmus, et al., "Electro-optic interface for ultrasensitive intracavity electric field measurements at microwave and terahertz frequencies," Optica, vol. 7, Issue 5, pp. 498-505 (May 2020).
A. Herter, et al., "Terahertz Generation in Thin-film Lithium Niobate Platform," CLEO, (2021)
Alexa Helter, el al., "Terahertz waveform synthesis from integrated lithium niobate circuits," physics.optics, pp. 1-12 (Apr. 26, 2022).
Alexa Herter, et al., "Terahertz waveform synthesis in integrated thin-film lithium niobate platform," Nature Communications, vol. 14, pp. 1-9 (Jan. 4, 2023).

* cited by examiner

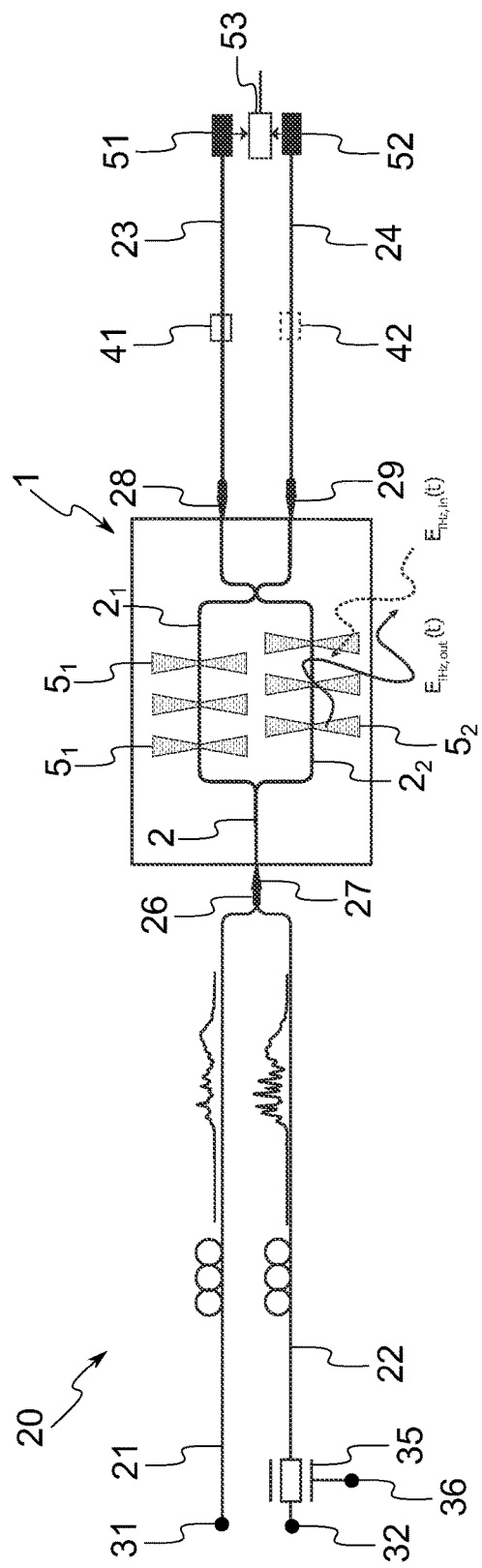
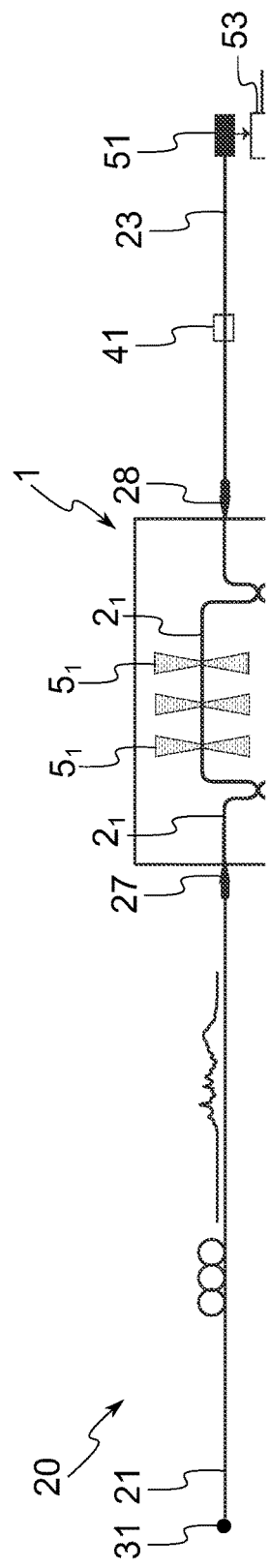
Fig. 3
Fig. 4

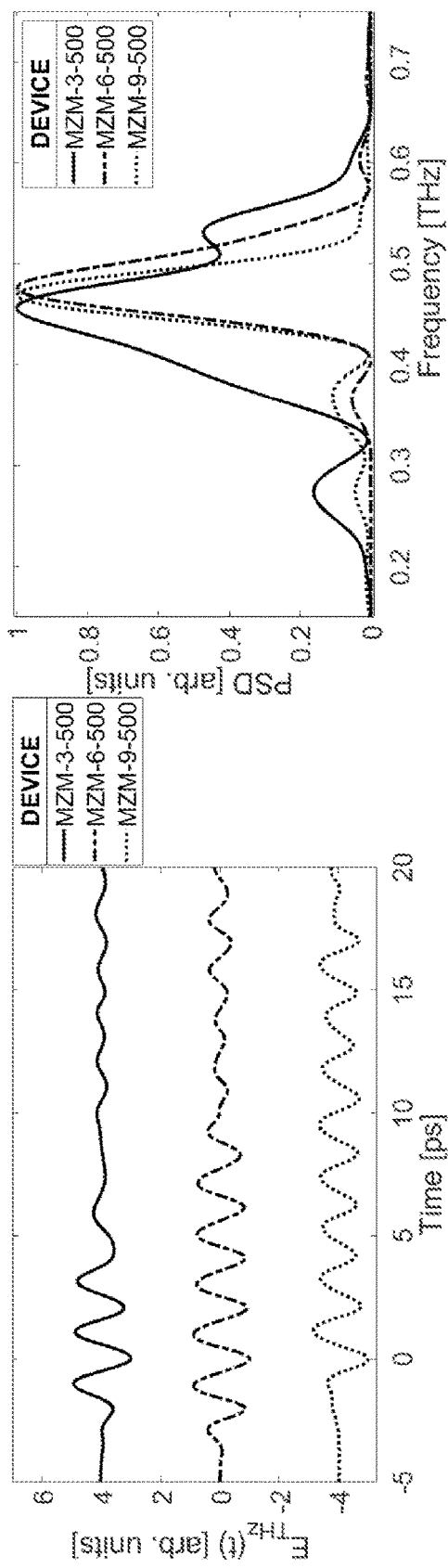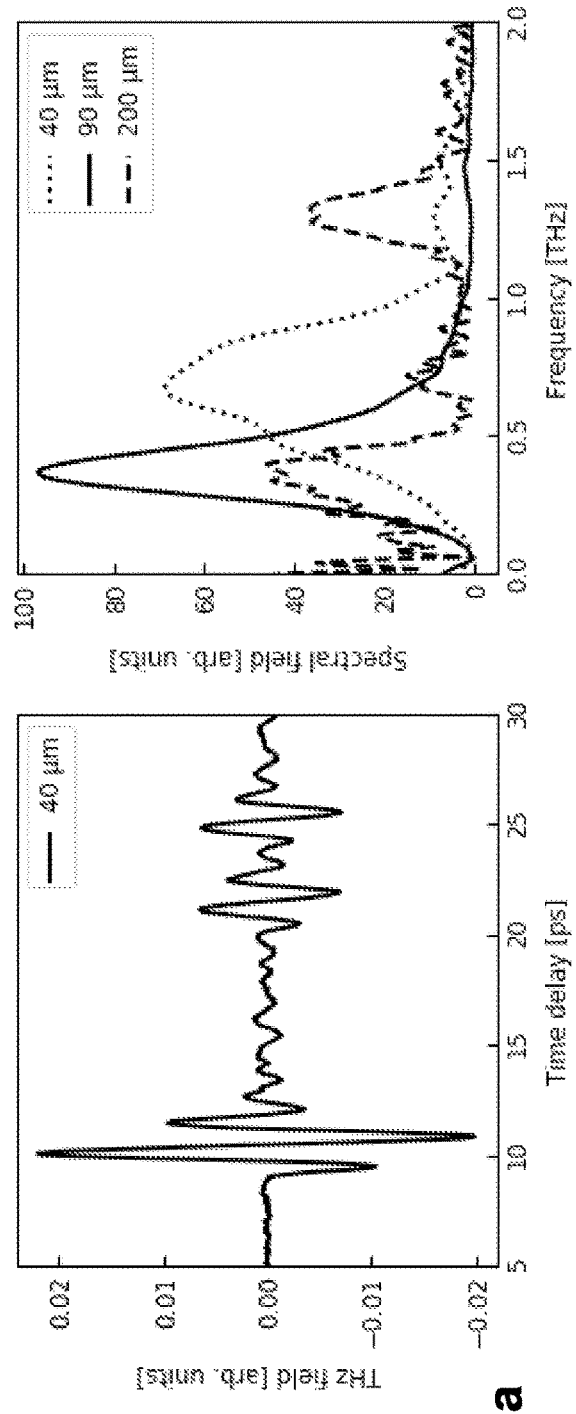
Fig. 8a
Fig. 8b
Fig. 9a
Fig. 9b

ON-CHIP TERAHERTZ THIN-FILM DEVICES

TECHNICAL FIELD

The present invention relates to a terahertz device for coherent detection of terahertz (THz) waves and/or coherent generation of terahertz waves via the use of optical integrated circuits realised on a thin-film platform, such as a lithium niobate platform. The device relies on a configuration comprising a plurality of waveguides, where the optical signals are configured in frequency, time, phase, polarisation and/or intensity to either detect or generate terahertz waves, or both simultaneously. In detection mode, the intensity of an optical signal in-coupled and propagating through the optical circuit, is modulated by an impinging THz wave. Specifically designed assemblies of antennas deposited on the chip to optionally enclose the optical waveguides within their gap allow for the collection and tight confinement of the THz radiation to a well-defined spatial region of the waveguides, thus greatly enhancing its interaction with the optical signal. The intensity modulation induced by the device operated in detection mode is recorded downstream from the chip, and it allows the reconstruction of the temporal evolution of the THz wave at the antennas. A generation mode can be employed in-tandem with the detection mode, by further configuring the optical signals in frequency, time, phase, polarisation, intensity, propagation direction and/or spatial mode. The invention also relates to a corresponding method of operating the device, which allows the device to be operated as a transceiver (in detection and generation mode simultaneously).

BACKGROUND

Coherent detection and generation of terahertz (THz) signals refers to the simultaneous read-out of the amplitude, phase and polarisation of a freely propagating or on-chip guided THz electric field wave, and the emission of terahertz waves with well-controlled phase, amplitude, frequency, (polarisation), etc. This can be achieved by using optical signals that are specifically tailored in their temporal, frequency, amplitude and polarisation content. Coherent detection allows thus the recording of the full temporal evolution of the electric field, giving access to the phase, and being able to both control the phase of an emitted wave and read it out is a resource for information processing.

This capability of measuring the full electric field of THz waves was quickly implemented into methods and apparatuses which are considered of a vital importance in diverse applications across many fields of research, such as optical communications, THz time-domain spectroscopy and ultrafast THz imaging and microscopy. Since historically, achieving speeds above few hundreds of gigahertz has been extremely challenging using all-electronic techniques (ultrafast photodiodes such as unicarrier travelling photodiodes or pin diodes suffer from strong electronic cut-off around few hundreds of gigahertz), a work-around was to rely on hybrid devices that combine optics and electronics in a coherent way, exploiting nonlinear effects such as photoconduction, second order or third order optical nonlinearities.

At present, coherent detection and generation are conventionally implemented using either photoconductive switches or the free-space electro-optic sampling technique. While photoconductive switches usually provide in detection mode higher sensitivity to relatively weak fields and are generally more suitable for the implementation of portable and compact THz systems, free-space electro-optic sampling exhibits its superior noise performance, and it is still considered the benchmark in many THz metrology systems. It is worth recalling that free-space electro-optic sampling relies on the Pockels effect occurring in electro-optic crystals: the linear polarisation of a probe beam (i.e., an optical signal) co-propagating with the THz wave through such a material, becomes elliptical because of the THz electric field-induced birefringence. By using an ellipsometry setup to convert the change of ellipticity into a difference signal between two photodetectors, the THz electric field waveform can be reconstructed by scanning the mutual delay between the optical and THz signal/pulses. We note that since the orientation of the THz-induced probe ellipticity depends on the polarity of the THz electric field, the phase information is automatically resolved with this scheme, whereas the exploitation of a differential acquisition method allows for the rejection of common-noise contributions, thus boosting both signal-to-noise ratio and dynamic range. Because of these unique characteristics, free-space electro-optic sampling is specifically adopted in those scenarios where very low-noisy measurements are a rather strict requirement. Inspired by the original configuration, many developments of this paradigm have led to the implementation of several innovative schemes providing more advanced features, such as multidimensional, single-shot and quantum enhanced detection. Despite the specific advantage that each of these configurations may possess compared to others, they all involve the use of large-footprint, free-space optomechanical components, which hamper a complete integration of the electro-optic sampling technique. Moreover, phase-matching conditions, high electro-optic coefficients, as well as good transparency in both THz and optical spectral window imply a quite stringent restriction on suitable material platforms as well as laser technologies that can be employed. A purely free-space approach does not allow for an optimum interaction between the focused THz and probe beams, being severely limited by the substantial mismatch of their two spot sizes. Finally, all of these technologies are not scalable, seamless nor easy to align optically, severely hampering the advancement of terahertz technologies that require a large number of components (in the thousands to millions and above) e.g. in optical communications.

Recently, a novel detection concept has been demonstrated as a first degree of integration of the electro-optic sampling technique into a monolithic chip. This approach is based on a hybrid silicon-organic chip, where the free-propagating THz beam is focused onto an antenna that hosts a plasmonic waveguide of a given interaction length. An optical signal that is sent along the plasmonic waveguide changes its phase as the waveguide is illuminated by the THz wave. In this case, the optical beam is strongly attenuated as it propagates along the plasmonic waveguide, severely impacting the maximal interaction length, the power efficiency and the scalability of the entire chip. The absorbed optical power is typically dissipated first as energetic electrons that may alter the noise of the system before they thermalise and get dissipated into heat. This structure, made from silicon technology, does not exhibit a second-order nonlinearity, requiring the silicon waveguide to be locally converted into the plasmonic design (with sub-micron features). In an additionally required processing step, the open waveguide was filled with a spin-coated layer of a highly electro-optic material (e.g., an electrically-poled polymer), so as to mediate the Pockels effect. The long-term stability and high-power resilience of organic materials is currently an active field of research, and having materials that are intrinsically stable is highly desirable. Finally, the chip was limited to having one single antenna in each waveguide and required illumination of the chip from the antenna side via strongly focusing and carefully aligned optics, strongly limiting the practicability of the chip in an open scene with a variety of terahertz signals, as it would be the case for instance in a real-life communication network. We note that the plasmonic waveguides are entirely unsuited for terahertz generation in the same chip due to the strong absorption of the optical signal. This strongly limits the prospects of realisation of a terahertz transceiver in this platform, requiring an additional source. All these aspects are severe roadblocks for the realisation of complex networks in hybrid silicon-organic structures.

Very recently, an outstanding endeavour has ultimately made possible to reliably integrate lithium niobate films with conventional silicon photonics technology. Importantly, lithium niobate is a material widely accepted by various industries, including the telecommunications industry. This has accelerated the demonstration of a plethora of on-chip integrated devices featuring unprecedented performances. Particularly in the THz area, a novel series of thin-film lithium niobate (TFLN) circuits has proved to provide a versatile platform for the generation of arbitrary THz waveforms, by exploiting an on-chip optical rectification mechanism as disclosed by Herter, A. et al. "Terahertz waveform synthesis in integrated thin-film lithium niobate platform", Nat. Commun. 2023 141 14, 1-9 (2023).

SUMMARY

It is an object of the present invention to overcome at least some of the problems identified above related to detecting and/or emitting terahertz radiation. According to the present invention, we present a new class of application-oriented, integrated devices operating the on-chip coherent detection and/or generation of terahertz waves, similarly to the silicon counterparts (that were limited only to detection), yet realised on a thin-film platform, such as a lithium niobate platform, the properties of which revolutionise the performance achievable with this new configuration.

According to a first aspect of the invention, there is provided a terahertz device for detecting or emitting or for both detecting and emitting electromagnetic waves in the terahertz frequency range as recited in claim 1.

There is thus proposed a miniaturised device able to detect microwave/terahertz fields (or their gradients) with controllable spatial, angular and spectral coverage by merits of a chip-scale architecture that combines integrated nonlinear waveguides, which optionally comprise a lithium niobate core. The device comprises collecting (a set of antennas), guiding (waveguide) and confining (antenna gaps) terahertz elements. The detection process exploits frequency up-conversion of the microwave/terahertz fields to the telecom domain inside the nonlinear optical waveguides. The waveguide dimensions can change across the chip and are chosen in a way to optimise locally the peak power, spectrum, polarisation, temporal profile, phase and propagation speed of optical signals that are guided along these waveguides. The exact choice of these properties allows a selective measurement of microwave/terahertz fields with predefined properties: detection bandwidth, temporal and spatial resolution, dynamic range, spectral sensitivity and signal-to-noise ratio. The geometry of the antennas is chosen to collect a terahertz beam with a controllable gain area in free space and store it on-chip. This allows the local electric field distribution of the terahertz beams to be controlled on chip. Collective effects from several terahertz elements are exploited to control the total antenna gain area, the spectral sensitivity window as well as the angular dispersion by means of phase matching. The extremely low propagation loss of optical waveguides is important to employ more than one receiving antenna as well as to define a certain device functionality, for example to either measure the field or the field gradient by on-chip interferometers.

The proposed device is configured to operate as an emitter, as a detector, or both, by means of optical pumping with pre-defined light. This enables synchronisation and time-shifting operations which are relevant at the system level. The transceiver operation may be used in communications to exchange data with a second transceiver. Other applications are for instance possible in spectroscopy, where the reflected radiation gives information about the material. In biology, a sample can be placed on the surface of the chip to measure the effect on the reflected radiation.

The proposed device enables a chip-scale terahertz transceiver that can have:
  an arbitrary aperture;
  an arbitrary acceptance angle and divergence;
  a custom-tailorable detection bandwidth;
  a custom-tailorable sensitivity;
  low optical loss;
  sub-wavelength measurement capabilities of field gradients; and
  straight-forward integration capabilities with other photonic structures.

The system-level operation of a transceiver enables:
  dual colour pumping across the visible, near-infrared and mid-infrared frequency band, enabling synchronous operation as an emitter and detector; and
  terahertz detection without the need of focusing optics.

The proposed device overcomes the need for periodic poling by propagation phase matching. Furthermore, mismatch between wavelengths of optical and terahertz beams enables sub-wavelength patterning of the terahertz elements. In other words, the dimensions of the terahertz elements are much smaller than the wavelength of the terahertz beams. The waveguides are transparent in a wide band where waveguide engineering can enable multi-colour pumping schemes. Moreover, an in-line electro-optic phase shifter (i.e., an electro-optic modulator placed before the on-chip terahertz device) may be used to adjust the operation mode at high speeds. The proposed device also provides narrow band detection whose bandwidth scales with the number of antennas.

According to a second aspect of the invention, there is provided a method of operating the terahertz device according to the first aspect.

Other aspects of the invention are recited in the dependent claims attached here to.

BRIEF DESCRIPTION OF THE DRAWINGS

Other features and advantages of the invention will become apparent from the following description of a non-limiting example embodiments, with reference to the appended drawings, in which:

FIG. 3 shows a first example terahertz device arrangement according to the present invention;

FIG. 4 shows a second example terahertz device arrangement according to the present invention;

FIGS. 8a and 8b show experimental measurement results obtained for the terahertz device configuration of FIG. 5e; and FIGS. 9a and 9b show experimental measurement results obtained for the terahertz device configuration of FIG. 5a.

DETAILED DESCRIPTION

Figure 1:
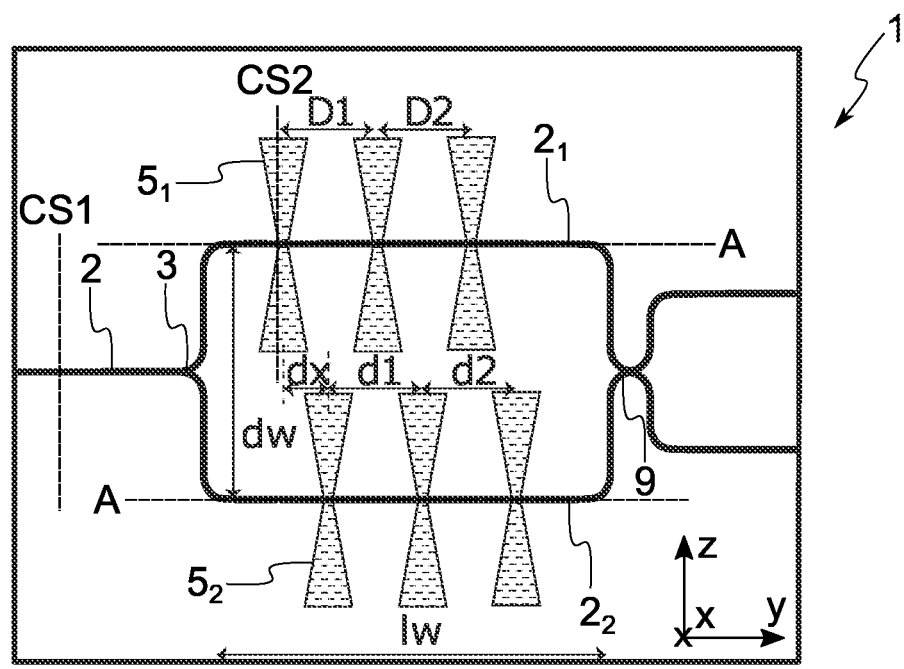
FIG. 1 schematically illustrates an example terahertz device according to the present invention.

Some embodiments of the present invention will now be described in detail with reference to the attached figures. As utilised herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z." Furthermore, the term "comprise" is used herein as an open-ended term. This means that the object encompasses all the elements listed, but may also include additional, unnamed elements. Thus, the word "comprise" is interpreted by the broader meaning "include", "contain" or "comprehend". Identical or corresponding functional and structural elements which appear in the different drawings are assigned the same reference numerals. It is to be noted that the use of words "first", "second" and "third", etc. may not imply any kind of particular order or hierarchy unless this is explicitly or implicitly made clear in the context. Furthermore, when referring to numerical ranges, the end values of the range are understood to be part of the respective range.

The following definitions may be used in the context of the present invention:

An optical input is an optical signal that can contain one single frequency, several frequencies (e.g., dual colour or multi-colour), or a broad bandwidth of frequencies. In time domain, it can be continuous wave, pulsed or any combination of the two.

A spectral filter is an optical component, in a fibre or in free space, which is configured to transmit or reflect only certain well-defined frequency components. Spectral filters used in the present invention may be dichroic mirrors, resonant metasurfaces, dielectric coatings, directional couplers, or any other chromatic components.

A modulator is an electro-optic component, in a fibre or in free space, which is configured to change the phase, intensity and/or polarisation of light upon electric stimuli. Modulators used in the present invention may be electro-optic modulators, acousto-optic modulators, piezoelectric modulators, optomechanical modulators, micro-electromechanical systems (MEMS) modulators, thermal modulators, or any other components that change optical signal properties when electronic signals are applied.

A coupler is a passive optical component, which is configured to take N inputs and redistributes them into M outputs (N×M coupler). As used in the present invention, a coupler may be a Y splitter (1×2 coupler), an Y combiner (2×1), an X-splitter (2×2), or any other splitter. The splitter may have chromatic functionalities and be a chromatic splitter, which would direct a given colour from one or more inputs into one or more outputs and another colour from one or more inputs into another, or the same one or more outputs. Furthermore, fibre-to-chip and chip-to-fibre couplers that may be used in the present invention may be any of a grating coupler, an edge coupler, or an evanescent coupler.

A fibre is a passive or active optical component that guides light. As used in the present invention, a fibre may be a single-mode fibre, a multi-mode fibre, a nonlinear fibre, a dispersion-compensating fibre, an amplifying fibre (fibre with rare-earth ion dopants to contain gain) or any combination of any of the above where each component may have any length, and where the order of the corresponding fibre pieces can be any of the possible permutations.

Function electronics refers to an electronic or digital component that takes signals from a first optical detector and a second optical detector (or any other number and combination of detectors) and computes a desired function from these signals. Function electronics as used in the present invention may be an electronic circuit for instance to perform balanced detection, correlation, coincidence, addition, subtraction, or any other mathematical function, or it may be an analogue-to-digital converter that is then used to compute the above functions digitally.

An antenna is a passive component, which can collect or emit terahertz radiation from or into free space. As used in the present invention, antennas may be metallic antennas (such as dipole antennas, bow tie antennas, lumped elements, log-spiral antennas, Yagi-Uda antennas, and/or Vivaldi antennas) and/or dielectric antennas.

The terahertz frequency band or range refers to electromagnetic waves with frequencies between 100 GHz and 10 THz.

A waveguide is a component that guides optical signals on-chip, composed of a core and a cladding arrangement. A waveguide as used in the present invention may be a rib, ridge, metal-infused, or slab waveguide. A non-linear waveguide is an optical waveguide structure that exhibits nonlinear optical properties, meaning that the behaviour of light passing through the waveguide is influenced by the intensity of the light itself, and by the terahertz wave. In contrast, linear waveguides do not exhibit such intensity-dependent and terahertz-dependent effects. In a nonlinear waveguide, the refractive index of the material changes in response to the intensity of the light propagating through it. This change in refractive index can result in various non-linear optical phenomena, including frequency conversion, self-phase modulation, four-wave mixing, and optical parametric amplification. Nonlinear waveguides are typically fabricated using materials with high nonlinear susceptibility. The waveguide structure confines and guides the light within a certain region, allowing for efficient interaction between the light and the nonlinear material.

Dispersion compensation in optical communication refers to the techniques and methods used to mitigate the effects of chromatic dispersion. Chromatic dispersion occurs when different wavelengths of light in an optical signal travel at different speeds, leading to the spreading out or "dispersion" of the signal over time. In fibre-optic communication systems, optical signals typically consist of multiple wavelengths of light. Each wavelength experiences a different velocity through the fibre due to the wavelength-dependent refractive index of the fibre material. As a result, the different wavelengths arrive at the receiver at different times, causing distortion and inter-symbol interference. Dispersion compensation involves introducing a complementary amount of dispersion into the system to counteract the dispersion introduced by the fibre. The compensation can be achieved using various methods: dispersion-compensating fibre (DCF), which is a specially designed optical fibre with a higher dispersion coefficient that is opposite in sign to the dispersion of the transmission fibre. By incorporating a section of DCF in the optical link, the accumulated dispersion can be partially or completely compensated, allowing the different wavelengths to arrive simultaneously; fibre Bragg gratings (FBGs), which are periodic variations in the refractive index of an optical fibre. They can be designed to have a dispersion characteristic that compensates for the dispersion of the transmission fibre. FBGs reflect specific wavelengths while allowing others to pass through, effectively compensating for the dispersion of those wavelengths; dispersion-compensating modules (DCMs), which are standalone devices that employ various dispersion compensation techniques, such as DCF or FBGs, to counteract the dispersion introduced by the transmission fibre. These modules can be inserted at specific points along the optical link to compensate for accumulated dispersion; and/or electronic dispersion compensation (EDC), which involves using digital signal processing techniques to compensate for dispersion. Optical signals are converted to electrical signals at the receiver, where advanced algorithms are applied to recover the original data by compensating for dispersion-induced distortions. EDC can be implemented in conjunction with other physical compensation methods or as a stand-alone solution.

The teachings of the present invention are next explained in more detail with reference to the figures. FIG. 1 schematically illustrates an example terahertz device 1, which in this example is configured to operate as a transceiver. In other words, the terahertz device 1 is configured to both detect and emit electromagnetic waves in the terahertz frequency range. For this purpose, optical light for detection and optical light for generation are arranged to be fed into the terahertz device 1 as explained later in more detail. It is to be noted, instead configuring the device as a transceiver, it could be configured to operate only as a detector to detect electromagnetic waves in the terahertz frequency range or as an emitter to emit electromagnetic waves in the terahertz frequency range.

As shown in FIG. 1, the terahertz device 1 comprises a nonlinear optical waveguide 2 configured to allow light, i.e., optical beams or signals to propagate through it. A first coupler 3, i.e., an input coupler, which in this this example is a 1×2 coupler is provided along or in the waveguide to split the waveguide into a first waveguide branch $2_1$, or arm and a second waveguide branch $2_2$ or arm. Main sections of the first and second waveguide branches are in this example arranged parallel or substantially parallel to each other. A set of first antennas $5_1$ (three antennas in this example) are coupled to the first waveguide branch. In a similar manner, a set of second antennas $5_2$ (three antennas in this example) are coupled to the second waveguide branch. In this example, three antennas are provided per waveguide branch. In this example, the antennas are bow-tie antennas, but other antenna types are also possible as will be explained later in more detail. Furthermore, in the configuration shown in FIG. 1, all the antennas are substantially of the same size, however, they could be of mutually different sizes instead. The antennas are arranged around the respective waveguide branch so that they in this example partially enclose the respective waveguide branch in a respective antenna gap of the respective antenna. More specifically, the antennas enclose at least partially lateral sides of cores 7 (illustrated in the cross-sectional view of FIG. 2b) of the waveguides.

As shown in the configuration of FIG. 1, the first antennas $2_1$ are not spatially aligned with the second antennas $2_2$ along the longitudinal axis A of the first and second waveguide branches. In other words, the second antennas are spatially offset by an offset distance dx with respect to the first antennas along the longitudinal axis A of the first and second waveguide branches. In this example, each one of the second antennas if offset by the same or substantially the same offset distance with respect to its spatially corresponding first antenna. However, this does not have to be the case, and the offset distance may not be constant. As shown in FIG. 1, the spatial separation, i.e., the distance between the first two first antennas is D1, while the spatial separation between the last two first antennas is D2. In the similar manner, the spatial separation, i.e., the distance between the first two second antennas is d1, while the spatial separation between the last two second antennas is d2. In this example, D1=D2=d1=d2, but this does not have to be the case. The distance between any two adjacent antennas along a given waveguide branch does not have to be constant (i.e., the antennas may be distributed non-equidistantly).

Along the light propagation path, after the set of antennas, there is provided a second coupler 9, i.e., an output coupler. In this example, the second coupler is a 2×2 coupler. It is to be noted that in this example, the light is arranged to propagate in the terahertz device 1 from left to right. Furthermore, as shown in FIG. 1, the transceiver aperture is in this case defined by dimensions dw and lw, where dw denotes the spatial separation orthogonally to the longitudinal axis of the waveguide branches and lw denotes the length of the main section of the waveguide branches.

Figure 2A:
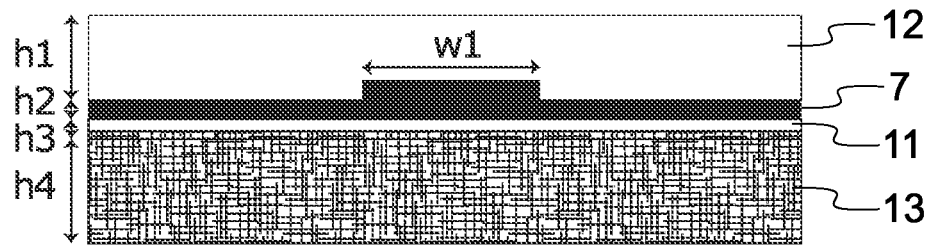
FIGS. 2a and 2b are cross-sectional views taken along lines CS1 and CS2 shown in FIG. 1, respectively.
Figure 2B:
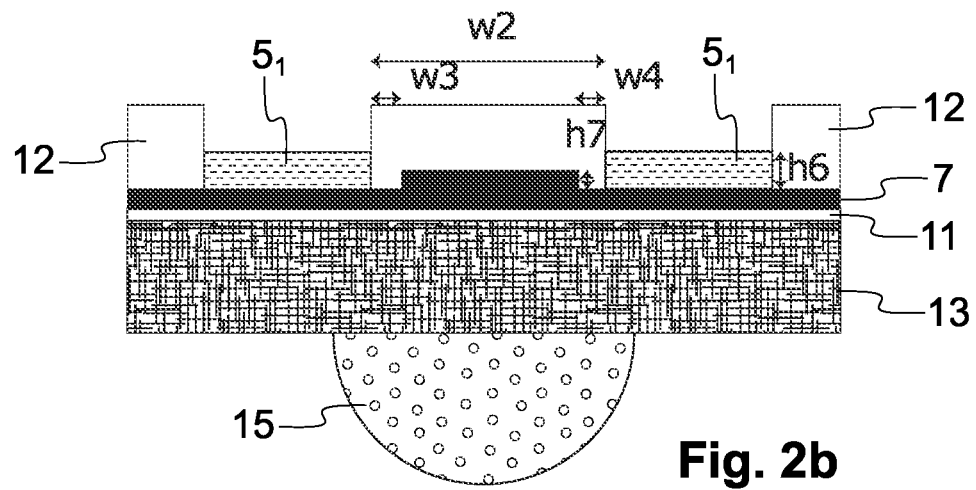

FIGS. 2a and 2b are partial cross-sectional views of the terahertz device 1, taken along dashed lines CS1 and CS2 shown in FIG. 1, respectively. FIGS. 2a and 2b thus show the terahertz device along the thickness direction. The waveguide in this example comprises a first dielectric layer 11 or a bottom dielectric layer, the core 7 and a second dielectric layer or a top dielectric layer 12. The waveguide is supported by a substrate 13, which in this case is a silicon substrate. The first and second dielectric layers 11, 12 are in this case made of silicon dioxide ($SiO_2$), and the waveguide core 7 is made of lithium niobate ($LiNbO_3$), which is a synthetic salt consisting of niobium, lithium, and oxygen. Lithium niobate is a colourless solid, which is insoluble in water. It has a trigonal crystal system, which lacks inversion symmetry and displays ferroelectricity, the Pockels effect, the piezoelectric effect, nonlinear optical polarizability, and photoelasticity. The Pockels effect, also known as the linear electro-optic effect, is a directionally dependent linear variation in the refractive index of an optical medium that occurs in response to the application of an electric field. FIG. 2b further show collecting optics 15, which in this example is placed at the bottom side of the substrate 13. The collecting optics may be an optical lens, such as a silicon lens, a Fresnel lens or a metalens, for collecting terahertz radiation. The waveguide thickness and thus also the thickness of the waveguide branches is defined collectively by the first and second dielectric layers 11, 12 and the core 7. In this example this thickness is at most 500 µm.

Table 1 below gives some possible and preferred value ranges for the dimensions shown in FIGS. 1, 2a, 2b, 6, 7a, and 7b.

TABLE 1

| Geometrical distance | Possible range (µm) | Desired range (µm) |
| --- | --- | --- |
| h1 | 0-5 | 0-0.8 |
| h2 | 0-1 | 0-0.3 |
| h3 | 1-100 | 2-3 |
| h4 | 0-10000 | 0-3000 |
| h6 | 0.01-0.8 | 0.15-0.5 |
| h7 | 0-1 | 0.1-0.6 |
| h8 | 0.01-0.8 | 0.15-0.5 |
| w1 | 0.1-5 | 0.5-2 |
| w2 | 0.1-10 | 3-8 |
| w3 | 0-4 | 0.5-3 |
| w4 | 0-4 | 0.5-3 |
| $L_{gap}$ | 0.5-10000 | 10-200 |
| $L_{pad}$ | 10-500 | 30-250 |
| d1 | 10-10000 | 50-500 |
| d2 | 10-10000 | 50-500 |
| D1 | 10-10000 | 50-500 |
| D2 | 10-10000 | 50-500 |
| dx | 0-10000 | 0-500 |
| dw | 50-50000 | 50-1000 |
| lw | 10-50000 | 10-1000 |

An example fabrication process of the terahertz device 1 starts with a film, such as a 600 nm thick film, of x-cut or z-cut lithium niobate bonded on a silicon substrate 13 with a thickness approximately 500 µm, the latter being topped with a buffer layer 11 of thermally-grown silicon dioxide ($SiO_2$), with a thickness of 2 µm, for instance. A rib waveguide 2 with a core of the same height as the lithium niobate film is realised by laterally etching the lithium niobate film 300 nm deep for example, while the core width is chosen as large as 1.5 µm. The waveguide 2 then splits into two arms through the 50/50 directional coupler 3 (first coupler), to be subsequently recombined by the second coupler 9, thus assuming the structure of a Mach-Zehnder interferometer (MZI). A series of antennas, in this case bow-tie antennas, is deposited across the two waveguide branches $2_1$, $2_2$ of the MZI. Adjacent antennas on a given branch are separated from each other by a given distance D1, D2, d1, d2. In this example D1=D2=d1=d2. Furthermore, in this case corresponding antennas on the opposed waveguide branches are displaced by $dx=D_1/2$. The reason behind this specific configuration will be explained later. The lateral distance between the 300-nm-thick gold pads (other thickness values are also possible) of the bow-tie antennas and the waveguide core is in this example 0.9 µm on both sides, which in this example forms a total antenna gap as large as G=3.3 µm. This value has been determined in such a way to almost completely remove the losses due to the leaking of the optical mode outside the core. This is useful to allow for several antennas around the same waveguide. In this example, the rib portion of the core has vertical side walls (when placed on a horizontal surface), but the walls may instead be angled, i.e., non-orthogonal, with respect to the base of the core. Finally, the antenna gap is covered with the second dielectric layer 12, such as another 800-nm-thick $SiO_2$ layer. The main waveguides, i.e., the waveguide portions where multiple waveguide branches are not present, can be accessed by means of fibre-to-chip or chip-to-fibre couplers, which in this example are grating couplers realised at each end of the MZI as shown in FIGS. 3 and 4, so to inject/collect the optical signal beam into/from free space. The design parameters of the antennas (gap and pad length, $L_{gap}$ and $L_{pad}$, respectively) depend on the resonant frequency which they are meant to operate at. Longer pads resonate at lower frequencies. Specifically, here we report on experimental findings about two nominal resonance frequencies: $f_{T1}$=0.25 THz, with $L_{gap}$=120 µm and $L_{pad1}$=200 µm; and $f_{T2}$=0.5 THz, featuring $L_{gap2}$=60 µm and $L_{pad2}$=90 µm.

FIGS. 3 and 4 show the system-level arrangement 20 of the terahertz device, which may also be referred to as a terahertz device arrangement or terahertz system. On the input side of the on-chip terahertz device 1 there are provided a first optical fibre 21 (or first input fibre) and a second optical fibre 22 (second input fibre), whereas on the output side of the terahertz device 1 there are provided a third optical fibre 23 (first output fibre) and a fourth optical fibre (second output fibre) 24. As shown in FIG. 3, the system comprises a combiner 26 of two optical signals for combining the optical signals from the different fibres, as well as a fibre-to-chip coupler 27 or input coupler or port between the fibres 21, 22 and the terahertz device 1. On the output side, at the interface between the terahertz device 1 and the optical fibres 23, 24, the system 20 comprises a first chip-to-fibre coupler 28 (first output coupler or port) and a second chip-to-fibre coupler 29 (second output coupler or port) for feeding the optical signals from the terahertz device 1 into the first output fibre 23, and the second output fibre 24, respectively. In this example, one or more optical signals (first optical signals) for terahertz wave detection are configured to be fed into the first input fibre at a first optical input port 31, whereas one or more optical signals (second optical signals, and which may also be called pump signals) for terahertz wave generation are configured to be fed into the second input fibre 22 at a second optical input 32.

The second input fibre 22 further comprises a modulator 35 with a radio frequency signal input 36. The in-line modulator 35 (i.e., a modulator placed before the terahertz device) is thus configured to modulate the input optical signals at microwave speeds. More specifically, the modulator 35 is configured to change the frequency, phase, intensity and/or polarisation of light upon electric stimuli. As mentioned above, the modulator may be an electro-optic modulator, an acousto-optic modulator, a piezoelectric modulator, an optomechanical modulator, a MEMS modulator, a thermal modulator, or any other component that change signal properties when electronic signals are applied. Thus, in this example, after modulation, the optical signals for terahertz wave detection and generation are characterised by one or more mutually different signal properties. The first input fibre may optionally also comprise a signal modulator to modulate the optical signal for terahertz detection. Furthermore, the optical signals for terahertz wave detection and/or generation may be dispersion-compensated. For this purpose, one or both of the input fibres may optionally be selected to be dispersion compensation fibres to achieve dispersion compensation of the optical signals before the chip (i.e., the terahertz device). Alternatively, or in addition, other dispersion compensation arrangements may be used as explained above.

As shown in FIGS. 3 and 4, the system 20 in this example also comprises a first spectral filter 41 and a second spectral filter 42 for carrying out spectral filtering. The first spectral filter 41 is arranged to filter the optical signals propagating through the first output fibre 23, whereas the second spectral filter 42 is arranged to filter the optical signals propagating through the second output fibre 24. The spectral filters allow optical detectors to detect only selected frequency components after the on-chip terahertz device 1. Any one of the output fibres 23, 24 may also optionally comprise a signal modulator.

As further shown in FIGS. 3 and 4, the system 20 in this example also comprises a first optical detector 51 and a second optical detector 52 for detecting optical signals, optionally in a given frequency range only. The first optical detector 51 is arranged to detect the optical signals propagating through the first output fibre 23 and optionally filtered by the first spectral filter 41, whereas the second optical detector 52 is arranged to filter the optical signals propagating through the second output fibre 24. There is also provided a computing unit 53 configured to compute a function from the signal from the first optical detector and from the signal from the second optical signal detector 52. The computing unit 53 includes function electronics for computing the function. Example functions (E) as a function of the signal ($Sig_1$) from the first optical detector 51 and the signal ($SiB_2$) from the second optical detector 52 may be the following:

$E=a*Sig_1+b*Sig_2$, where $a$ and $b$ are arbitrary real numbers.

$E=\langle Sig_1(t)*Sig_2(t+\tau)\rangle$, where $\langle \cdot \rangle$ is the time average and $\tau$ is an arbitrary time delay.

$E=\langle Sig_1(t)^m*Sig_2(t+\tau)^n\rangle$, where $\langle \rangle \cdot \langle$ is the time average, $\tau$ is an arbitrary time delay, and $m$ and $n$ are arbitrary real numbers.

Other functions that combine a linear combination, a product, an averaging, an integration and/or a differentiation.

The system of FIG. 4 is similar to the system of FIG. 3, but with the difference that the optical signals for terahertz wave detection and generation are coupled in the terahertz device 1 as opposed to these signals being coupled before the terahertz device 1. For this reason, the system does not comprise the combiner 26, but instead there are two fibre-to-chip couplers, namely a first fibre-to-chip coupler 27 and a second fibre-to-chip coupler 55 at the interface between the first and second input fibres 21, 22 and the on-chip terahertz device 1. Furthermore, it is to be understood that the systems may be modified in many ways. For instance, a spectral filter may be provided along one or both of the input fibres. Also, an amplifier, such as erbium-doped fibre amplifier (EDFA) may be provided along one or both of the input and/or output fibres, optionally between the modulator 35 and the respective fibre-to-chip coupler 27, 55. In this way, losses of the system can be overcome using the amplifier where higher order nonlinear effects, such as self-phase modulation, are possible. In the case of terahertz generation, it may also be useful to introduce a positive prechirp to the optical signal using a tuneable low loss prism pair in connection with a dispersion-compensating fibre.

In operation, the mode polarisation is aligned with the z-axis (see FIG. 1), which coincide with the c-axis of the LN crystal, thus allowing the largest Pockels coefficient to be exploited, i.e., $r_{33}\approx33$ pm/V, for x-cut film. Finally, the effective group refractive index retrieved in this case is $n_g$=2.27. The design parameters of the antennas (namely, gap and pad length, $L_{gap}$ and $L_{pad}$, respectively) depend upon the operating resonant frequency of the antennas (longer pads resonating at lower frequencies). It is worth noticing that, differently from more conventional designs, in this example, the antennas are bow-tie antennas featuring a pair of elongated metallic electrodes (the length being approximately 1/10 of the nominal terahertz resonant wavelength, $\lambda_R$) placed across its entire gap length. This implementation aims to prolong and thus enrich the terahertz—optical signal interaction from each single antenna element. In particular, $L_{gap}$ is selected by imposing that the signal group delay $T_P$ (i.e., the time taken by the optical pulse to propagate through the entire antenna gap) is much shorter than a cycle of the resonant terahertz frequency $f_R$, i.e., $T_P<<1/f_R$, thus ensuring a coherent building up the optical signal modulation. In operation, there is a bipolar distribution of the z-component of the terahertz field ($E_{THz}^z$) in the y-0-z plane at the antenna resonance (first antenna mode, ~350 GHz), revealing that the electric near-field forms a rather uniform linear pattern running all along the antenna gap. Regarding the electric field distribution of the same component in the z-0-x plane, there are two strong and symmetric maxima, each of them found in extremely restricted regions surrounding the metallic electrodes (the antennas). However, a third local maximum is indeed formed at the centre of the gap, hosting the optical waveguide, thus ensuring the occurrence of spatial overlap between terahertz and optical signal fields.

As previously mentioned, besides the mere increase of overall terahertz collection efficiency of the antenna array, compared to the single element, we designed the periodic structure so as to operate according to a coherent enhancing mechanism resembling the concept of periodic poling for second-order nonlinear material ($\chi^{(2)}$). Historically, periodic poling has been introduced to overcome the efficiency drop occurring in highly phase-mismatched second-order processes, particularly for very long media. It is implemented by engineering the material so to periodically reverse the sign of its second-order domains. This can be achieved by either stacking together multiple layers of the same material, while alternating the orientation of the domains, or by acting externally with a static electric field, which can force the domain re-orientation at sufficiently high strengths. Despite the technique employed, periodically poled materials can be regarded as one-dimensional (1D) structures. By envisioning our class of devices, we revisited the concept of periodic poling by spatially separating positive domains from the negative ones, thus resulting in a two-dimensional (2D) geometry consisting of two identical periods (twice as large as the original period) running parallel to each other. This way, an optical signal travelling through either of the two periods will give rise to a nonlinear interaction governed by the same sign of the nonlinear coefficient. Based on this preliminary digression, we note that in the geometry of our devices, longitudinally displacing the arrays of antennas $5_1$, $5_2$ along the two parallel branches $2_1$, $2_2$ of the terahertz device 1 can be regarded as creating two periodic structures. Specifically, adjacent antennas along the same branch are separated from each other by a distance D1, D2, d1, d2, whereas adjacent antennas on the opposed-facing branch are displaced by dx=D1/2. However, since the orientation of the LN domains on the two branches $2_1$, $2_2$ is identical (i.e., same sign of $r_{33}$), the two sub-signals originated at the input coupler 3, each traveling along one branch, will ideally experience an identical phase change. This prevents from establishing any intensity modulation at the output coupler 9, where the sub-signals are recombined. Instead, the key aspect of our devices is that rather than acting on the material itself, domain inversion is here achieved under terahertz beam illumination at a specific frequency, i.e., the phase-matching (PM) frequency $f_{PM}$. Such a frequency is a specific signature of each device since it is inherently imprinted in the periodicity of the antenna array. More specifically, the array is in this example designed to operate as follows. The value D1 is set to be equal to the distance travelled by the optical signal in a time interval $\Delta t_{PB}$ as long as a full cycle of $f_{PM}$, i.e., $\Delta t_{PB}=1/f_{PM}$. This condition ensures that, e.g., the propagating upper sub-signal will cross each antenna $5_1$ while the terahertz near-field oscillations exhibit always the same polarity, thus accumulating coherent phase change contributions along the whole branch. As a convention, we use the upper branch as a reference and associate positive oscillations of the terahertz near-field ($E_{THz}^+$) to it. Conversely, on the lower arm, the longitudinal spatial offset dx leads the other sub-signal lag by a time interval equal to $\Delta t_{PB}/2$ compared to the upper sub-signal, which corresponds to half cycle of $f_{PM}$. Because of this, the polarity of the terahertz electric near-field has flipped by the time the lower sub-signal reaches the displaced antenna array, thus imparting a phase change of opposite sign ($E_{THZ}^-$) compared to that of the upper branch. Finally, the interference of the two opposite-modulated sub-signals will now give rise to an intensity modulation pattern of the out-coupled optical signal, which reproduces the bipolar oscillations of the terahertz electric near-field.

In conclusion, we have demonstrated the operation of a new integrated paradigm for coherent detection of terahertz pulses, which we named on-chip electro-optic sampling (OC-EOS). Such a technique is operated via the use of optical integrated circuits (i.e., Mach Zehnder interferometers) realised in the above example in TFLN technology, which eventually allows the high nonlinearity of lithium niobate to be brought into a silicon technology. We showed a new concept of an integrated detection scheme, inspired by the concept of periodic-poling: two parallel arrays of antennas $5_1$, $5_2$, such as bow-tie antennas, collect the terahertz radiation impinging on the entire device 1, while an optical signal propagates in the optical waveguides running through the centre of the antenna gaps. The optical signals experience a phase change proportional to the instantaneous near field enhanced in the gap of the respective antenna. However, thanks to the specific design of the array which times the arrival of the optical signal at each antenna element, the phase accumulation will take place with the same terahertz oscillation polarity on each branch $2_1$, $2_2$ of the terahertz device 1. Moreover, the recombination of the two branches is also timed in such a way to constructively interfere when the two sub-signals are recombined, thus resulting in the intensity modulation of the optical signal. Our experimental investigation demonstrates that such intensity modulation faithfully maps the bipolar oscillations of the terahertz near-field established under illumination of a terahertz pulse. Large terahertz beam diameters give rise to particularly sensitive measurements at the array phase-matching frequency.

Indeed, since the distance between two adjacent antennas along the respective waveguide branch is designed to temporally equal a full cycle of the resonant terahertz frequency $f_T$, the optical signal will experience nearly the same phase change contribution while crossing each antenna element towards the recombining coupler 9 (the second coupler). However, as the orientation of the lithium niobate dipole on the two branches is identical (i.e., same sign of $r_{33}$), if the arrays of antennas are symmetrically deposited along each branch of the terahertz device, the total instantaneous phase delay experienced by each optical signal in the two branches would be also identical. As a consequence, no optical signal intensity modulation would be attained at the terahertz device output. In order to counteract this issue, the terahertz device 1 is in this example designed to be naturally unbalanced under terahertz illumination, by adding a longitudinal offset (dx) to the location of the antenna array on one of the two branches $2_1$, $2_2$. Such a spatial offset is determined by imposing that the group time delay taken by the optical signal to travel the distance dx is equal to half cycle of $f_T$. This way, the polarity of the near terahertz electric field has flipped by the time the optical signal reaches the shifted antenna array, thus imparting a phase change of opposite sign ($E_{THz}^-$) to that of the other branch ($E_{THz}^+$). Therefore, the recombination of the two opposite-modulated optical signals from the two branches will now give rise to the intensity modulation of the out-coupled optical signal. Thus, in the above configuration, an optical signal is coupled through an MZI interferometer, hosting two arrays of mutually displaced antennas on both of its waveguide branches. Each optical signal in the respective branch experiences a phase change of identical magnitude, yet opposed in sign while propagating through the two branches under terahertz illumination, which results in the intensity modulation of the out-coupled optical signal.

The present invention thus proposes a new class of application-oriented, integrated photonics devices operating the on-chip electro-optic sampling technique, and in the present example realised through TFLN technology. The adoption of the TFLN platform brings about several advantages, leading to a crucial advancement towards a complete development of the on-chip electro-optic sampling paradigm. Firstly, the relatively high refractive index contrast between the lithium niobate (LN) core and the silicon dioxide cladding (~0.7) allows for the low-loss and low-dispersive propagation of an optical pulsed signal, especially at the broadband regime. Moreover, since LN is inherently a non-centrosymmetric material, its refractive index can be directly modulated by the terahertz electric field harvested by a bow-tie antenna, for instance. This way, the requirement for a plasmonic design hosting the terahertz—optical signal interaction is lifted, greatly enhancing the overall signal power output. For the same reason, the interaction length between optical signal and terahertz waves could be ideally extended to the upper limit dictated by the coherence length between the two waves propagating through the antenna gap. Furthermore, we take advantage of the low propagation losses and effectively prolong the nonlinear terahertz—optical signal interaction beyond the size of a single collecting element, by exploiting arrays of antennas, which in this example are deployed on each branch of the terahertz device 1. The larger footprint of an array configuration allows for a greatly enhanced collection efficiency of the terahertz radiation, while the careful engineering of its periodic pattern enables for boosted sensitivities of the entire device to specific terahertz frequency components present in the incoming terahertz pulse. As such, the proposed class of devices demonstrate that the adoption the TFLN technology has the potential to completely revolutionise the area of phase-sensitive integrated terahertz detection.

Figure 5A:
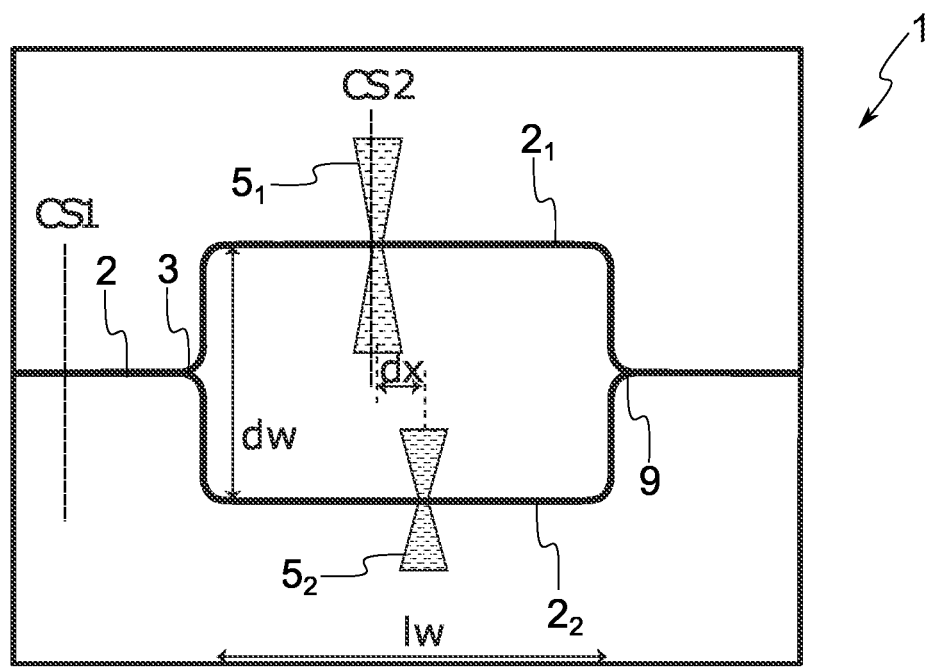
FIGS. 5a to 5i schematically illustrate further example terahertz devices according to the present invention.
Figure 5B:
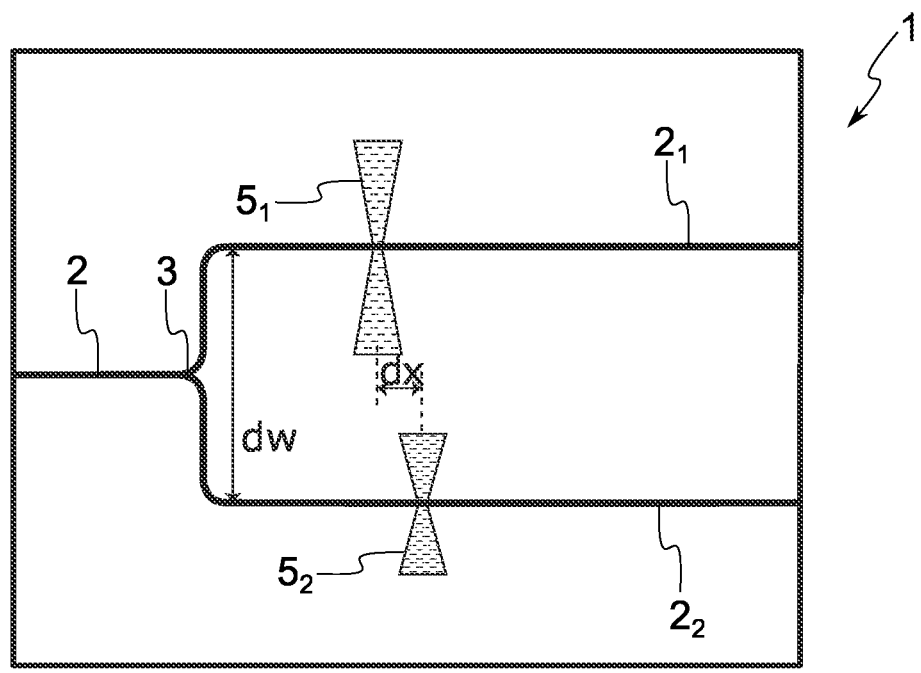
Figure 5C:
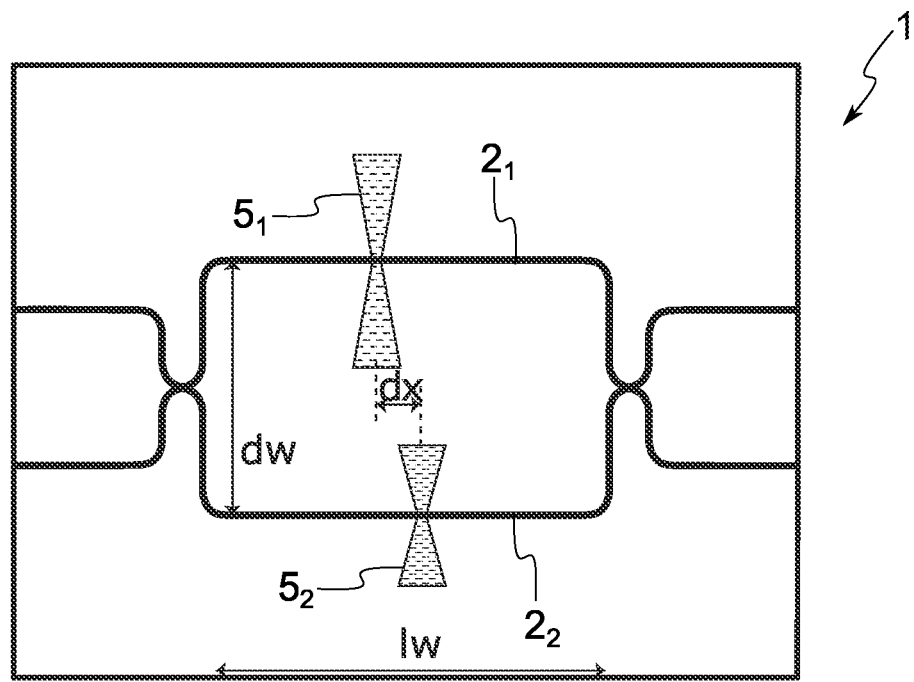
Figure 5D:
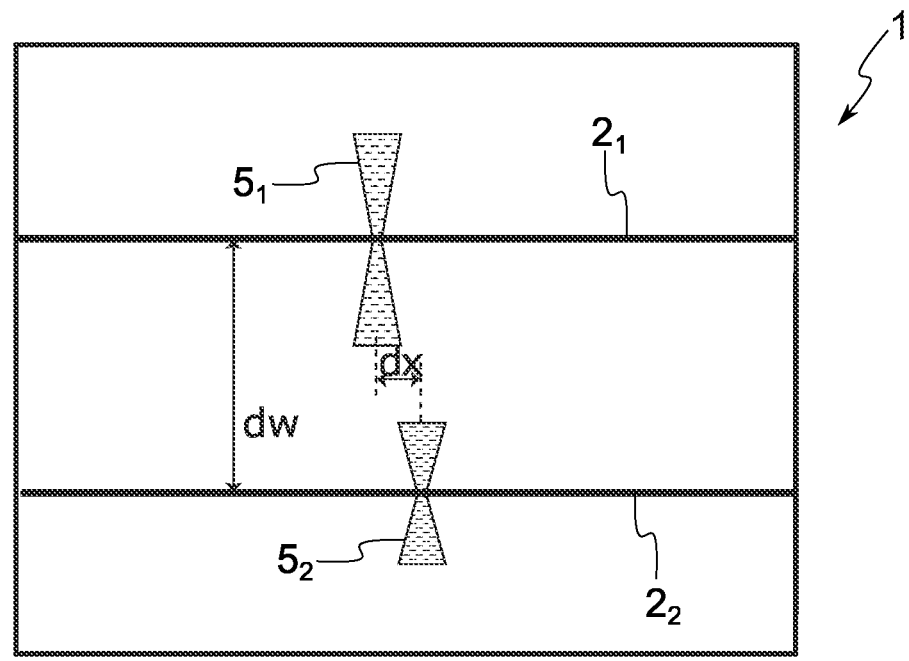

FIGS. 5a to 5i show further variants of the terahertz device 1. All these devices can be operated as a terahertz wave detector, terahertz wave generator, or both, depending on the characteristics of the optical signal travelling in the waveguide branches. The terahertz device 1 of FIG. 5a comprises only one antenna $5_1$, $5_2$ along each waveguide branch $2_1$, $2_1$. Furthermore, in this example, the antennas are of different types and/or they have different dimensions. The terahertz device of FIG. 5b differs from the device of FIG. 5a in that there is no output coupler 9. In this case, the two waveguide branches $2_1$, $2_2$ are directly coupled by chip-to-fibre couplers (not shown in FIG. 5b) to the optical fibres. The terahertz device of FIG. 5c is similar to the device of FIG. 5a but with the difference that the terahertz device of FIG. 5c is coupled to two input fibres and two output fibres (not shown in FIG. 5c). The terahertz device of FIG. 5d differs from the device 1 of FIG. 5b in that there is no input coupler 3. In all the example devices of FIGS. 5a to 5d, the antenna $5_1$ along the first waveguide branch $2_1$, is of a different type compared with the antenna $5_2$ along the second waveguide branch $2_2$, and/or the dimensions of these antennas are mutually different.

Figure 5E:
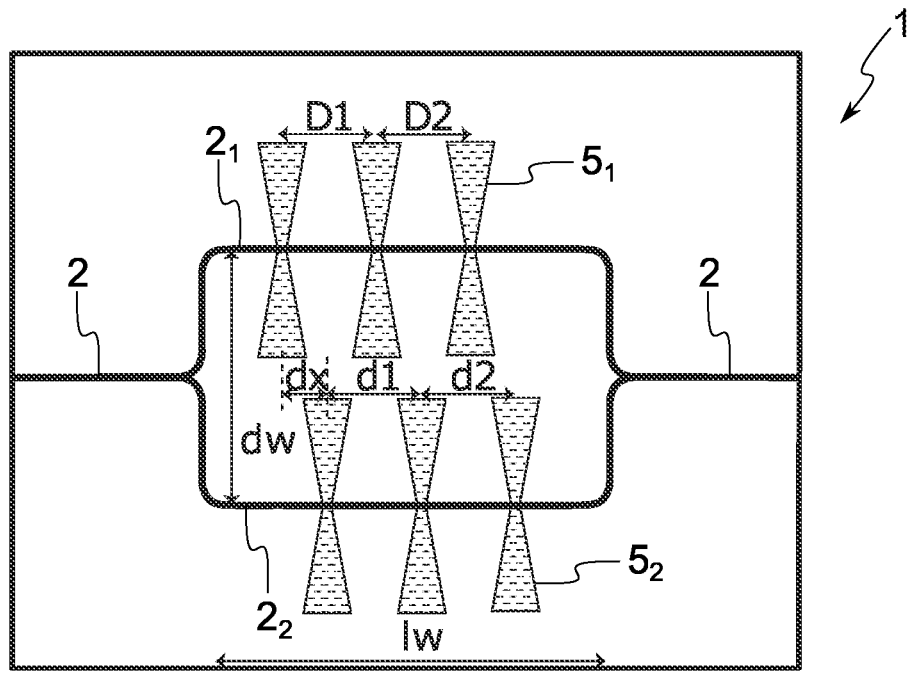
Figure 5F:
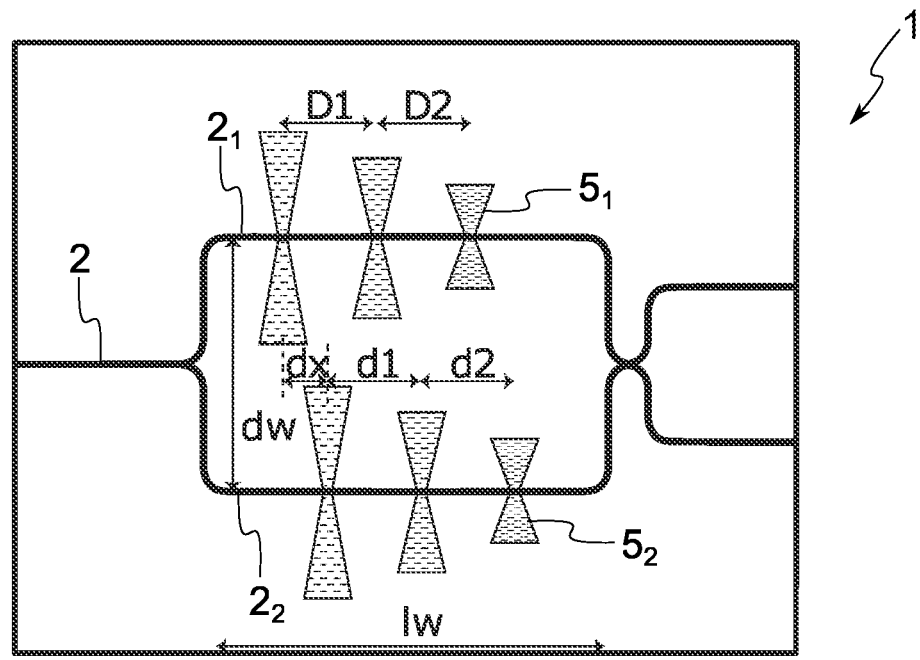
Figure 5G:
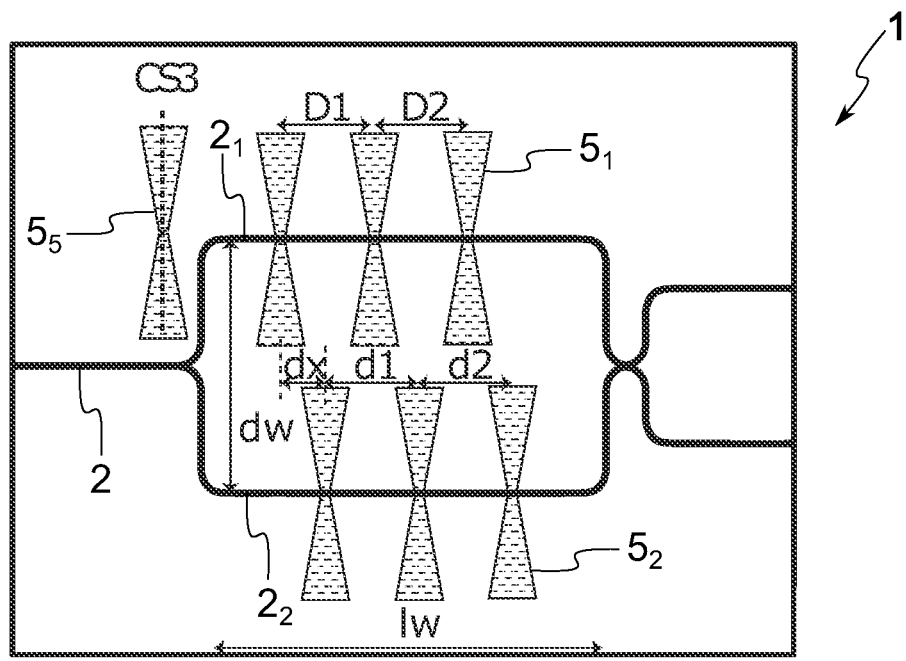
Figure 5H:
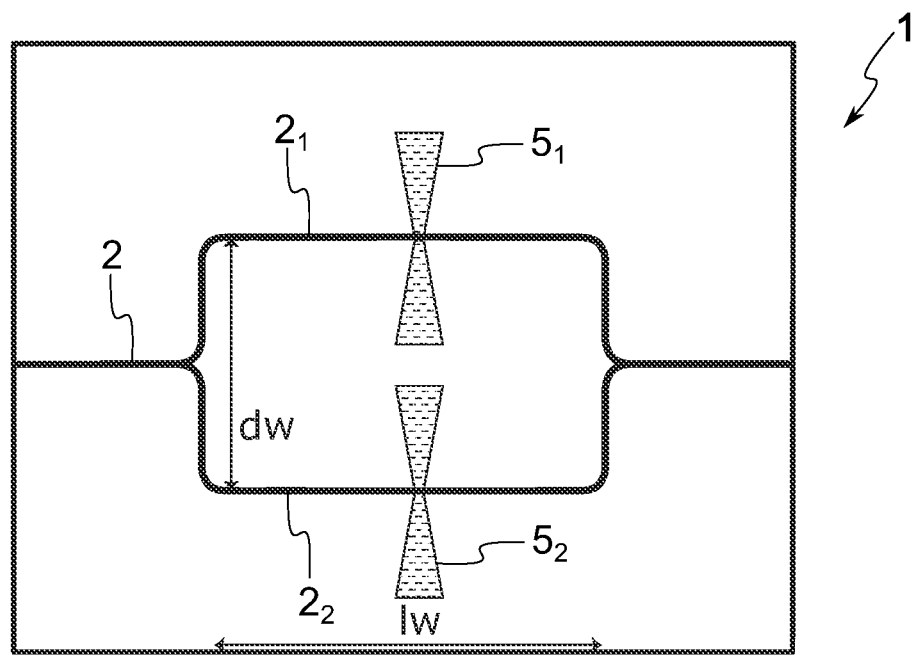
Figure 6:
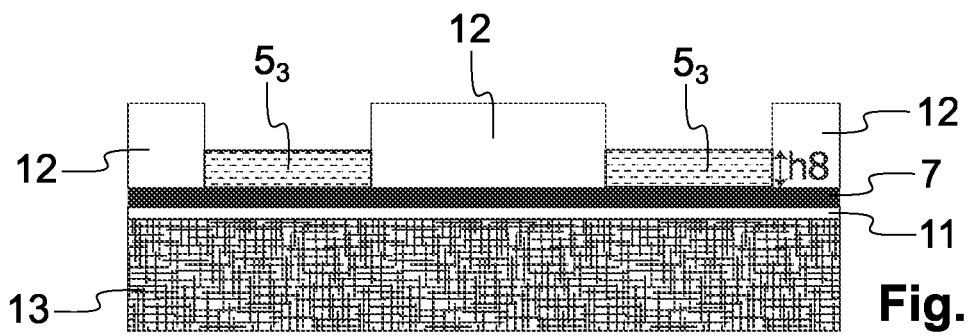
FIG. 6 is cross-sectional view taken along line CS3 shown in FIG. 5g.

The terahertz device 1 of FIG. 5e resembles the device of FIG. 1, but with the difference that the output coupler 9 is a 2×1 coupler instead of a 2×2 coupler. The terahertz device 1 of FIG. 5f is similar to the device of FIG. 1, but with the difference that the antennas $5_1$ along the first waveguide branch $2_1$ are mutually of different types and/or their dimensions are mutually different. Furthermore, the antennas $5_2$ along the second waveguide branch $2_2$ are mutually of different types and/or their dimensions are mutually different. The terahertz device of FIG. 5g is similar to the device of FIG. 5f, but with the difference that the device of FIG. 5g further comprises one or more fifth antennas $5_5$ not placed in immediate vicinity of any of the waveguide branches. The purpose of the fifth antenna $5_5$ is to capture terahertz radiation, but without interacting with the optical signal because there is no waveguide through this antenna. The cross-sectional view of FIG. 6 is taken along line CS3 shown in FIG. 5g. The terahertz device 1 of FIG. 5h differs from the device of FIG. 5a in that that there is no spatial displacement between the first antenna $5_1$ and the second antenna $5_2$. The terahertz device of FIG. 5h may thus be used as a field gradient detector.

Figure 5I:
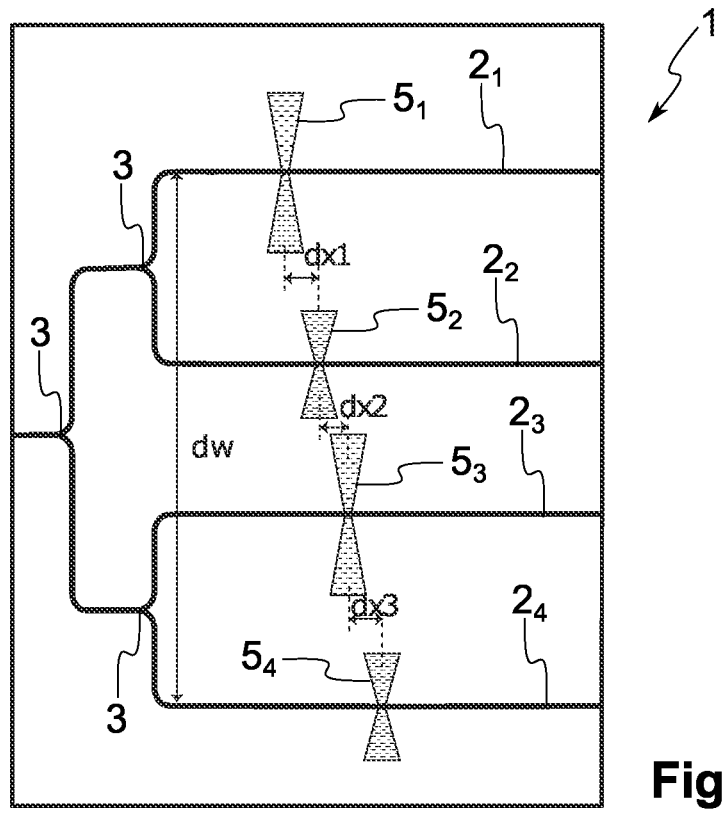

FIG. 5i illustrates a variant, where the network of waveguide branches comprises four waveguide branches, namely a first waveguide branch $2_1$, a second waveguide branch $2_2$, a third waveguide branch $2_3$, and a fourth a first waveguide branch $2_4$. These waveguide branches are provided with a set of antennas, in this example one or more first antennas $5_1$ are provided along the first waveguide branch $2_1$, one or more second antennas $5_2$ are provided along the second waveguide branch $2_2$, one or more third antennas $5_3$ are provided along the third waveguide branch $2_3$, and one or more fourth antennas $5_4$ are provided along the fourth waveguide branch $2_4$. The terahertz device 1 in this configuration comprises three input couplers 3.

Further variants of the terahertz device are also possible. For example, in any configuration shown in the above figures, it is possible to align the first and second antennas $5_1$, $5_2$ along the first and second waveguide branches $2_1$, $2_2$ so that there is no spatial displacement along these branches between the corresponding antennas. Also, it is possible to perform electric field poling at any of the patterned antennas, to revert the sign of $\chi^{(2)}$. Moreover, different antenna types and/or sizes may be used in any configuration. It is also possible to design the terahertz device 1 so that no antennas are arranged along one of the waveguide branches. In the above examples, the antennas are positioned on top of the waveguide core 7, but some or all of the antennas could be placed below the core 7. It is further possible to design the terahertz device 1 so that the waveguide branches do not pass through the antenna gaps, but they would instead be placed in immediate vicinity of the waveguide branches. Furthermore, in any design, the waveguide branches may not be of equal length. In other words, the first waveguide branch $2_1$ is characterised by a first length, whereas the second waveguide branch $2_2$ is characterised by a second length, where the first length is different from the second length. It is also possible to design the terahertz device so that it comprises at least three waveguide branches. In this case, the main portions or sections of the waveguide branches may be arranged parallel or substantially parallel to each other. Antennas may be provided along one or more of the waveguide branches, optionally along all of the waveguide branches. The waveguide branches may be combined in any way by using any types of suitable combiners. Regarding the waveguide core material used in the waveguides of the devices of the present invention, many materials may be used instead of lithium niobate, such as barium titanate, lithium tantalate, or even silicon nitride or silicon. However the last two the do not have $\chi^{(2)}$ nonlinearities.

It is further to be noted that any of the optical signal generator, modulator, filter, dispersion compensation and optical detector can be either in the fibre (as in the examples above) or optionally, any one of them may be directly arranged on the same chip as the terahertz device 1, in any of the waveguides of the waveguide network. This would mean that all or any of the above components may be incorporated directly on the same chip (in lithium niobate in the above example).

Figures 7A, 7B, 7C, 7D, 7E:
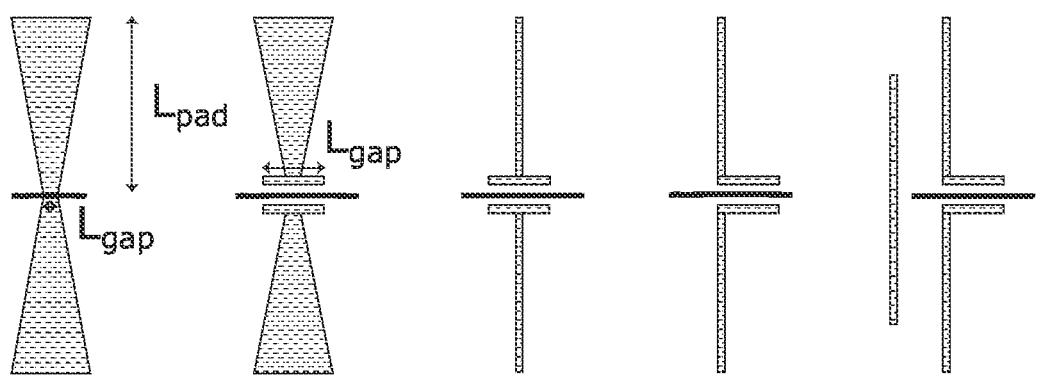
FIGS. 7a to 7e illustrate example antennas that can be used in the terahertz devices according to the present invention.

FIGS. 7a to 7e show possible antennas that may be used in the terahertz device 1 according to the present invention. The antennas as shown in FIGS. 7a to 7e also show a portion of the respective waveguide branch placed in the respective antenna gap at the centre of the antennas. FIG. 7a illustrates a bow-tie antenna, whereas FIG. 7b shows a bow-tie antenna with an extended interaction length. This interaction length is extended by placing two electrical conductors substantially in parallel to each other so that they extend along the antenna gap. In other words, these conductors are substantially parallel to the respective waveguide branch passing through the antenna gap. The length of these two conductors defines the interaction region, where the waveguide guides the optical signal through it. FIG. 7c shows a bipolar antenna, whereas FIG. 7d shows an asymmetrical dipolar antenna. FIG. 7e illustrates a Yagi-Uda antenna.

The antennas are configured to confine the electric field of the terahertz signal into the interaction region of the antennas. The exact design of the antenna determines the spectral parts of the THz radiation collected most efficiently and can be adapted to the application purpose. The position of the antennas along the two waveguide branches may be shifted by a certain distance as explained above. As a consequence, the interaction between the terahertz field and the optical signal is not simultaneous but shifted by the difference of propagation time of the optical signal. This distance may be chosen to cause a time difference, which depends on the time period of the terahertz signal, and which in this example is substantially equal to a half or a multiple of the half of the time period of the terahertz signal. In this case, at the time of interaction, the optical signal sees an opposite field direction of the terahertz signal for the two branches and the induced phase shift is also opposite. Afterwards, the two waveguide branches are combined again. By the design of the waveguide branches $2_1$, $2_2$ an additional relative phase shift of pi/2 between the two signals can be induced, which is independent of the terahertz field. The phase shift may be added in addition to the spatial offset of the antennas. This can be achieved by making the waveguide branches of unequal length, height and/or of unequal width. This can also be achieved by adding a thermal phase shifter to at least one of the waveguides. Like this the combination of the two optical signals translates the phase-shift caused by the terahertz field into an intensity modulation of the optical signal intensity leaving the device.

The above-described terahertz devices may be used for instance to operate as a sub-cycle terahertz field detector. More specifically, the previously described modulation of a near-infrared (NIR) optical signal can be utilised to measure the time-resolved electric field of a terahertz waveform. In this example, we use a commercial pulsed NIR laser source with a centre wavelength of 1560 nm. The pulse duration, which in our case is initially 100 fs, determines the time resolution of the measurement and should be less than a quarter of the time period of the desired terahertz frequency. The cleaved facet of an optical fibre is aligned on top of the chip and directs the NIR signal onto an integrated grating coupler diffracting the light into the waveguide. At the same time an additional output of the same laser source is used to generate a terahertz signal synchronised with the NIR optical pulses. A delay stage on the generating optical signal path allows the timing of the terahertz generation to be modified. The terahertz radiation is collected and focused onto the terahertz device from the backside of the chip. A (silicon) lens placed on the backside of the chip could help guide the terahertz field to the device since it would avoid the reflection of radiation hitting the chip under an angle. The device then translates the THz field strength into a change of the NIR intensity propagating through the chip. Since we use such short pulses, the NIR signal overlaps with only one particular point of the overall terahertz waveform. By changing the delay between the terahertz and NIR signal with the previously mentioned delay stage, we can shift the point we measure the terahertz field strength and sample along the whole waveform. The change in the transmitted NIR intensity for varying positions gives information about the temporal evolution of the electric field strength within the terahertz signal. To measure this intensity, we collect the NIR signal diffracted by another grating coupler with another cleaved optical fibre and measure it on a photodetector.

To summarise the above teachings, one embodiment of the present invention proposes a terahertz device 1 for detecting or emitting or for both detecting and emitting electromagnetic waves in the terahertz frequency range, the terahertz device 1 comprising:

a first waveguide branch $2_1$ and a second waveguide branch $2_2$, the first and second waveguide branches $2_1$, $2_2$ being configured to allow optical signals to propagate through them, the first and second waveguide branches $2_1$, $2_2$ being nonlinear dielectric elements with a thickness of at most 500 micrometres;

an antenna arrangement comprising a set of antennas $5_1$, $5_2$ for capturing and/or emitting electromagnetic waves in the terahertz frequency range, the antennas $5_1$, $5_2$ being placed along at least one of the waveguide branches $2_1$, $2_2$ in an immediate vicinity of the respective waveguide branch $2_1$, $2_2$ (i.e., the antennas being within a distance of at most 1 mm or more specifically at most 10 μm from the respective waveguide branch) and/or around the respective waveguide branch $2_1$, $2_2$ to at least partially enclose the respective waveguide branch $2_1$, $2_2$ in a respective antenna gap of the respective antenna $5_1$, $5_2$; and wherein the antenna arrangement comprises at least two antennas arranged along one of the first and second waveguide branches $2_1$, $2_2$ and at least one antenna arranged along the other one of the first and second waveguide branches $2_1$, $2_2$, or wherein the antenna arrangement comprises at least two antennas of mutually different types and/or sizes, or wherein the antenna arrangement comprises at least two antennas arranged so that no antennas are arranged along one of the waveguide branches $2_1$, $2_2$.

According to one example, at least two of the antennas are characterised by one or more mutually different antenna properties, and/or the first and second waveguide branches are characterised by one or more mutually different waveguide properties. The antenna properties are at least one of the following: antenna type (e.g., passive or active antenna), antenna size, and antenna material. The waveguide properties are at least one of the following: waveguide branch length, waveguide branch width, waveguide branch cross-sectional dimension(s), waveguide branch material, presence of a separate fibre-to-chip coupler coupled to the respective waveguide branch, and presence of a separate chip-to-fibre coupler coupled to the respective waveguide branch. In other words, one of the antennas is in its nature different from the other antenna, and/or one of the waveguides is in its nature different from the other one.

Experimental tests were carried out in a typical THz-TDS setup of FIG. 5e. The results are shown in FIGS. 8a and 8b, where for the sake of simplicity, we refer to the terahertz device 1 with the following labelling convention: MZM-x-y, where "x" stands for the number of antennas on each branch of the terahertz device 1 (MZM), whereas "y" indicates the built-in phase-matching frequency (in GHz). An estimated 4-mW optical signal power is fed into the waveguide 2. The readout terahertz waveforms are recorded via lock-in detection of the electric signal generated by a photodiode acquiring the out-coupled optical signal, while scanning the time delay between the optical and terahertz pulses. Firstly, we characterised the family of devices MZM-x-500 at an operating nominal phase-matching frequency of $f_{PM}$=500 GHz. Reconstructed terahertz transients are comprehensively reported in FIGS. 8a and 8b. In particular, FIG. 8a reports the terahertz transients retrieved for the terahertz device of FIG. 5e placed 1.5 cm away from the focal plane of the terahertz radiation as a function of the number of antennas per branch, from 3 (highest waveform) to 9 (lowest waveform). In all cases, a characteristic multi-cycle shape is observed, with a pseudo-period estimated as $T_{PM} \approx 1/f_{PM}'$, where $f_{PM}'$=470 GHz, as determined from the corresponding spectra calculated via Fast Fourier Transform (FFT) and plotted in FIG. 8b. The small discrepancy between the values of $f_{PM}$ and $f_{PM}'$ could be ascribed to both fabrication tolerances and uncertainty in the evaluation of the effective refractive index. The waveforms retrieved with devices MZM-6/9-500 reveal the onset of long-lasting oscillations featuring a nearly uniform envelope and having a time duration proportional to the number of the antennas in the array. Indeed, by applying Rayleigh's law of diffraction for the terahertz wave, the terahertz spot has enlarged up to a diameter greater than 8 mm after the 1.5-cm propagating distance, more than enough to completely cover the entire array lengths. Furthermore, the FFT spectra reported in FIG. 8b clearly indicate a quite noticeable narrowing of the linewidth centred at $f_{PM}'$ with the increasing length of the array, which is a sign of an enhanced frequency sensitivity.

Experimental tests were also carried out for the terahertz device configuration of FIG. 5a. The results are shown in FIGS. 9a and 9b. In FIG. 9a, a typical time-trace of a terahertz waveform is plotted. The device used to measure this trace was using antennas with a length of 40 μm. In FIG. 9b, we show the Fourier transform time-traces measured with three different devices. It shows, how the size of the antennas determines the spectral parts the devices are sensitive to.

While the invention has been illustrated and described in detail in the drawings and foregoing description, such illustration and description are to be considered illustrative or exemplary and not restrictive, the invention being not limited to the disclosed embodiments. Other embodiments and variants are understood and can be achieved by those skilled in the art when carrying out the claimed invention, based on a study of the drawings, the disclosure and the appended claims. Further variants may be obtained by combining the teachings of any of the designs explained above.

In the claims, the word "comprising" does not exclude other elements or steps, and the indefinite article "a" or "an" does not exclude a plurality. The mere fact that different features are recited in mutually different dependent claims does not indicate that a combination of these features cannot be advantageously used. Any reference signs in the claims should not be construed as limiting the scope of the invention.

The invention claimed is:

1. A terahertz device for detecting or emitting or for both detecting and emitting electromagnetic waves in the terahertz frequency range, the terahertz device comprising:
a first waveguide branch and a second waveguide branch, the first and second waveguide branches being configured to allow optical signals to propagate through the first and second waveguide branches, the first and second waveguide branches being nonlinear dielectric elements with a thickness of at most 500 micrometers;
an antenna arrangement comprising at least two antennas for capturing and/or emitting electromagnetic waves in the terahertz frequency range, the antennas being placed along at least one of the waveguide branches in an immediate vicinity of the respective waveguide branch and/or at least partially around the respective waveguide branch to at least partially enclose the respective waveguide branch in a respective antenna gap of the respective antenna; and
wherein two of the antennas are characterized by one or more mutually different antenna properties, and/or the first and second waveguide branches are characterized by one or more mutually different waveguide properties, or wherein two of the antennas are arranged along one of the waveguide branches.

2. The terahertz device according to claim 1, wherein the antenna arrangement comprises at least two antennas arranged along one of the first and second waveguide branches and at least one antenna arranged along the other one of the first and second waveguide branches, or wherein the antenna arrangement comprises at least two antennas of mutually different types and/or sizes.

3. The terahertz device according to claim 1, wherein one or more antennas along the second waveguide branch are spatially offset with respect to the spatially corresponding antennas along the first waveguide branch along a longitudinal axis of the first waveguide branch and/or the second waveguide branch.

4. The terahertz device according to claim 3, wherein an offset distance is determined by imposing that the group time delay taken by the optical signals to travel the spatial offset distance is dependent on a cycle of the electromagnetic waves in the terahertz range, and wherein the offset distance is optionally determined by imposing that the group time delay taken by the optical signals to travel the spatial offset distance is optionally equal or substantially equal to a half cycle or a multiple of the half cycle of the electromagnetic waves in the terahertz range.

5. The terahertz device according to claim 1, wherein the number of antennas along the first waveguide branch is at least two, and the number of antennas along the second waveguide branch its at least two.

6. The terahertz device according to claim 5, wherein any two antennas along the first waveguide branch are mutually of a different type and/or difference size, and/or any two antennas along the second waveguide branch antennas are mutually of a different type and/or difference size.

7. The terahertz device according to claim 1, wherein the spatial separation between any two adjacent antennas along the first and/or second waveguide branch equals substantially twice a spatial offset distance between the respective antenna along the first waveguide branch and the spatially corresponding antenna along the second waveguide branch along a longitudinal axis of the first waveguide branch and/or the second waveguide branch.

8. The terahertz device according to claim 1, wherein the first and/or second optical waveguide branches comprise(s) a core made of lithium niobate, barium titanate, and/or lithium tantalate.

9. The terahertz device according to according to claim 1, wherein the first and/or second optical waveguide branches comprise(s) a core, and wherein the core has a thickness of between 0.1 micrometers and 0.9 micrometers.

10. The terahertz device according to according to claim 1, wherein the first and/or second waveguide branches comprise(s) a first dielectric layer, a second dielectric layer, and a core arranged between the first and second dielectric layers.

11. The terahertz device according to claim 1, wherein the antenna properties are at least one of the following: antenna type, antenna size, and antenna material, and/or wherein the waveguide properties are at least one of the following: waveguide branch length, waveguide branch cross-sectional dimension(s), waveguide branch material, existence of a separate fiber-to-chip coupler coupled to the respective waveguide branch, and existence of a separate chip-to-fiber coupler coupled to the respective waveguide branch.

12. The terahertz device according to claim 1, wherein the terahertz device is built on an integrated circuit, and wherein the integrated circuit further comprises any one of the following elements: an optical signal generator, a modulator, a signal filter, dispersion compensation arrangement and an optical signal detector.

13. The terahertz device according to claim 1, wherein the terahertz device further comprises an input coupler and/or an output coupler, wherein the couplers are passive optical components forming a splitter or a combiner.

14. The terahertz device according to claim 1, wherein the terahertz device comprises one or more passive antennas arranged outside the immediate vicinity of the first and second waveguide branches.

15. The terahertz device according to claim 1, wherein the terahertz device comprises a set of waveguide branches comprising the first waveguide branch and the second waveguide branch and further comprising at least a third waveguide branch configured to allow optical signals to propagate through the third waveguide branch and being a nonlinear dielectric element with a thickness of at most 500 micrometers.

16. A terahertz system comprising the terahertz device according to claim 1, and wherein the system further comprises one or more input optical fibers coupled to one or more input ports of the terahertz device and one or more output optical fibers coupled to one or more output ports of the terahertz device.

17. The terahertz system according to claim 16, wherein a signal modulator is arranged along the one or more of the input optical fibers to change the phase, intensity and/or polarization of the optical signal upon electric stimuli, and/or the one or more input optical fibers comprises a dispersion compensation arrangement to achieve dispersion compensation of the optical signals.

18. The terahertz system according to claim 16, wherein the system further comprises one or more spectral filters arranged along the one or more input optical fibers and/or along the one or more output optical fibers.

19. The terahertz system according to claim 16, wherein the system comprises a first output optical fiber and a first optical signal detector configured to detect the optical signal propagating in the first output optical fiber, wherein the system further comprises a second output optical fiber and a second optical signal detector configured to detect the optical signal propagating in the second output optical fiber, and wherein the system further comprises a computing unit configured to compute a function from the optical signal from the first optical detector and from the optical signal from the second optical signal detector.

20. A method of operating an on-chip terahertz device for detecting or emitting or for both detecting and emitting electromagnetic waves in the terahertz frequency range, the terahertz device comprising:
a first waveguide branch and a second waveguide branch, the first and second waveguide branches being configured to allow optical signals to propagate through the first and second waveguide branches, the first and second waveguide branches being nonlinear dielectric elements with a thickness of at most 500 micrometers;
an antenna arrangement comprising at least two antennas for capturing and/or emitting electromagnetic waves in the terahertz frequency range, the antennas being placed along at least one of the waveguide branches in an immediate vicinity of the respective waveguide branch and/or at least partially around the respective waveguide branch to at least partially enclose the respective waveguide branch in a respective antenna gap of the respective antenna; and
wherein the method comprises the step of selectively feeding a first optical signal and a second optical signal into any of the first and second waveguide branches to selectively operate the terahertz device as a terahertz wave detector, a terahertz wave generator and/or a terahertz wave transceiver, and wherein the first and second optical signals are characterized by one or more mutually different signal properties.

* * * * *